(12) United States Patent
Chen et al.

(10) Patent No.: US 10,497,708 B1
(45) Date of Patent: Dec. 3, 2019

(54) MEMORY STRUCTURE AND FORMING METHOD THEREOF

(71) Applicant: Yangtze Memory Technologies Co., Ltd., Wuhan, Hubei Province (CN)

(72) Inventors: He Chen, Wuhan (CN); Jin Wen Dong, Wuhan (CN); Jifeng Zhu, Wuhan (CN); Zi Qun Hua, Wuhan (CN); Liang Xiao, Wuhan (CN); Yong Qing Wang, Wuhan (CN)

(73) Assignee: Yangtze Memory Technologies Co., Ltd., Wuhan, Hubei Province (CN)

( * ) Notice: Subject to any disclaimer, the term of this patent is extended or adjusted under 35 U.S.C. 154(b) by 0 days.

(21) Appl. No.: 16/128,520

(22) Filed: Sep. 12, 2018

Related U.S. Application Data

(63) Continuation of application No. PCT/CN2018/098612, filed on Aug. 3, 2018.

(51) Int. Cl.
*H01L 21/8239* (2006.01)
*H01L 27/11529* (2017.01)
*H01L 23/00* (2006.01)
*H01L 27/11531* (2017.01)
*H01L 27/11578* (2017.01)
*H01L 21/762* (2006.01)
*H01L 21/768* (2006.01)
*H01L 21/311* (2006.01)
*H01L 29/06* (2006.01)

(52) U.S. Cl.
CPC .. *H01L 27/11529* (2013.01); *H01L 21/31116* (2013.01); *H01L 21/76202* (2013.01); *H01L 21/76224* (2013.01); *H01L 21/76877* (2013.01); *H01L 24/05* (2013.01); *H01L 27/11531* (2013.01); *H01L 27/11578* (2013.01); *H01L 29/0649* (2013.01); *H01L 2924/30105* (2013.01)

(58) Field of Classification Search
CPC ......... H01L 27/11529; H01L 27/11531; H01L 27/11578; H01L 2924/30105; H01L 21/31116; H01L 21/76202; H01L 21/76224
USPC .......................................................... 257/213
See application file for complete search history.

(56) References Cited

U.S. PATENT DOCUMENTS

2008/0295329 A1* 12/2008 Muthukumar ........ H01L 23/147
  29/840
2009/0108318 A1* 4/2009 Yoon .................... H01L 21/8221
  257/306

(Continued)

*Primary Examiner* — Long K Tran
(74) *Attorney, Agent, or Firm* — Winston Hsu

(57) ABSTRACT

A memory structure provided by this invention includes a first substrate, a dielectric layer, a bonding pad, and an isolation structure. The first substrate includes a substrate layer and a memory layer. The substrate layer has opposite first and second surfaces, the memory layer is located on the first surface of the substrate layer, and the first substrate includes a bonding pad region. The dielectric layer is disposed on the second surface of the substrate layer. The bonding pad is disposed on the surface of the dielectric layer in the bonding pad region. The isolation structure penetrates through the substrate layer and is disposed at the edge of the bonding pad region and surrounds the substrate layer in the bonding pad region, and the isolation structure is used for isolating the substrate layer in the bonding pad region from the substrate layer at the periphery of the isolation structure.

20 Claims, 5 Drawing Sheets

(56) References Cited

U.S. PATENT DOCUMENTS

2012/0181602 A1* 7/2012 Fukuzumi ........... H01L 27/0688
257/326
2014/0332872 A1* 11/2014 Kim .................... H01L 27/0629
257/296

* cited by examiner

MEMORY STRUCTURE AND FORMING METHOD THEREOF

CROSS REFERENCE TO RELATED APPLICATIONS

The present application is a continuation of International Application No. PCT/CN2018/098612, filed Aug. 3, 2018. The present application is based on and claims priority to International Application PCT/CN2018/098612, filed Aug. 3, 2018, the contents of which are hereby incorporated by reference in their entirety.

BACKGROUND OF THE INVENTION

1. Field of the Invention

The invention relates to the technical field of the semiconductor, and more particularly, to a memory structure and a forming method thereof.

2. Description of the Prior Art

In recent years, the development of the flash memory is especially rapid. The main feature of the flash memory is that it can keep the stored information for a long time without consuming electricity. Additionally, the flash memory has the advantages of high integration, fast access speed, easy erasing and rewriting, etc. Therefore, the flash memory has been widely used in many fields such as microcomputer and automatic controlling. In order to further improve the bit density of the flash memory and reduce the bit cost simultaneously, the three-dimensional flash memory (3D NAND) technology is developed rapidly.

The 3D NAND flash memory structure includes a memory array structure and a CMOS circuit structure disposed on the memory array structure. The memory array structure and the CMOS circuit structure are usually formed on two different wafers respectively, and then the CMOS circuit wafer is bonded to the top of the memory array structure through a bonding process to connect the CMOS circuit and the memory array circuit together. Next, the back surface of the wafer that the memory array structure is located is thinned, and the entire circuit can be connected through the contacts and the bonding pads penetrating through the back surface. An insulating layer is disposed between the bonding pads and the back surface of the wafer. When currents flow through both of the bonding pads and the wafer, a strong parasitic capacitance is formed between the bonding pads and the wafer, and it slows down the speed of calculation and storage.

In the prior art, the parasitic capacitance is generally reduced by increasing the thickness of the insulating layer between the bonding pads and the wafer. In order to effectively reduce the parasitic capacitance between the bonding pads and the wafer, the thickness of the insulating layer is usually required to be greater than 1.4 micrometers. Additionally, it is required to form the through holes penetrating through the insulating layer and the wafer simultaneously to electrically connect the circuit to the external wires. However, the aspect ratio of the through holes penetrating through the wafer is increased when the thickness of the insulating layer is increased. The critical dimension and the shape of the through holes penetrating through the wafer should be strictly controlled, and deviations in the process may cause problems such as open circuit or electricity leakage. Accordingly, the difficulty of the process is greatly increased, more advanced semiconductor processing apparatuses are required, and the process cost is increased.

In short, effectively reducing the parasitic capacitance of the memory structure has become an urgent problem to be solved at present.

SUMMARY OF THE INVENTION

The technical problem to be solved by this invention is providing a memory structure and a forming method thereof to effectively reduce the parasitic capacitance of the memory structure and improve the performance of the memory device.

The technical scheme of this invention provides a memory structure, including: a first substrate, including: a substrate layer and a storage layer, the substrate layer including a first surface and a second surface opposite to the first surface, and the storage layer being disposed on the first surface of the substrate layer, wherein the first substrate comprises a bonding pad region; a dielectric layer disposed on the second surface of the substrate layer; a bonding pad disposed on a surface of the dielectric layer above the bonding pad region; and an isolation structure penetrating through the substrate layer and disposed at an edge of the bonding pad region, wherein the isolation structure surrounds the substrate layer in the bonding pad region, and the isolation structure is used for isolating the substrate layer in the bonding pad region from the substrate layer at a periphery of the isolation structure.

Optionally, the memory structure further includes a plurality of first contacts penetrating through the substrate layer in the bonding pad region and the dielectric layer, wherein the bonding pad is connected to the first contacts.

Optionally, each of the first contacts includes a metal pillar and an insulating sidewall disposed on a surface of a sidewall of the metal pillar.

Optionally, a critical dimension of the isolation structure is less than a critical dimension of the first contacts.

Optionally, the isolation structure includes an isolation trench penetrating through the substrate layer and an isolation material filling the isolation trench.

Optionally, a minimum distance between the isolation structure and a projection of the bonding pad on the substrate layer is 0.5 micrometers.

Optionally, the isolation structure includes two or more isolation rings, and one of the isolation rings is embedded or surrounded by another one of the isolation rings.

Optionally, a distance between adjacent isolation rings of the two or more isolation rings is in a range from 0.8 micrometers to 1.2 micrometers.

Optionally, a plurality of second contacts are formed in the storage layer, and the first contacts are connected to the second contacts.

Optionally, the memory structure further includes: a second substrate, wherein a peripheral circuit is formed in the second substrate, and the second substrate is bonded to a surface of the storage layer, wherein a memory cell and a memory circuit structure connected to the memory cell are formed in the storage layer, and wherein the peripheral circuit in the second substrate and the memory circuit structure in the storage layer are electrically connected.

In order to solve the above problem, an embodiment of this invention provides a forming method of a memory structure, including: providing a first substrate, the first substrate including a substrate layer and a storage layer, the substrate layer including a first surface and a second surface opposite to the first surface, the storage layer being disposed on the first surface of the substrate layer, and the first substrate including a bonding pad region; forming a dielectric layer on the second surface of the substrate layer; forming an isolation structure penetrating through the substrate layer, wherein the isolation structure is disposed at an edge of the bonding pad region and surrounds the substrate layer in the bonding pad region, and the isolation structure is used for isolating the substrate layer in the bonding pad region from the substrate layer at a periphery of the isolation structure; and forming a bonding pad on a surface of the dielectric layer above the bonding pad region.

Optionally, the forming method of the memory structure further includes forming a plurality of first contacts penetrating through the substrate layer in the bonding pad region and the dielectric layer, wherein the bonding pad is connected to the first contacts.

Optionally, a forming method of the first contacts and the isolation structure includes: etching the dielectric layer to the substrate layer to form a first opening and a plurality of second openings in the dielectric layer; etching the substrate layer through the first opening and the second openings simultaneously to respectively form an isolation trench and a plurality of contact holes penetrating through the substrate layer; forming an insulating material layer filling the isolation trench and the first opening and covering a surface of an internal sidewall of each of the contact holes and a surface of an internal sidewall of each of the second openings; removing the insulating material layer disposed at bottoms of the contact holes; forming a metallic material layer filling the contact holes and the second openings; and performing a planarization process by using the dielectric layer as a stop layer.

Optionally, a critical dimension of the isolation structure is less than a critical dimension of the first contacts.

Optionally, forming the isolation structure penetrating through the substrate layer further includes: forming an isolation trench penetrating through the substrate layer, wherein the isolation trench is disposed at the edge of the bonding pad region and surrounds the bonding pad region; and forming an isolation material filling the isolation trench.

Optionally, a minimum distance between the isolation structure and a projection of the bonding pad on the substrate layer is 0.5 micrometers.

Optionally, the isolation structure includes two or more isolation rings, and one of the isolation rings is embedded or surrounded by another one of the isolation rings.

Optionally, a distance between adjacent isolation rings of the two or more isolation rings is in a range from 0.8 micrometers to 1.2 micrometers.

Optionally, a plurality of second contacts penetrating through the storage layer are formed in the storage layer, and the first contacts are connected to the second contacts.

Optionally, a second substrate is bonded to a surface of the storage layer of the first substrate, a memory cell and a memory circuit structure connected to the memory cell are formed in the storage layer, and a peripheral circuit in the second substrate and the memory circuit structure in the storage layer are electrically connected.

In the memory structure of this invention, the isolation structure is formed in the substrate layer and served as the physical isolation structure between the substrate layer under the bonding pad and other regions of the substrate layer. The substrate layer under the bonding pad is isolated from the surroundings and no current is formed therein. Accordingly, the parasitic capacitance between the bonding pad and the substrate layer is reduced, and the performance of the memory structure is increased. Further, since the parasitic capacitance between the bonding pad and the substrate layer is relatively small, the dielectric layer having a smaller thickness can be adopted, thereby reducing the process cost and the difficulty of the process.

In the forming method of the memory structure in this invention, the isolation structure is formed in the substrate layer and served as the physical isolation structure disposed between the substrate layer under the bonding pad and the substrate layer in the device region. The parasitic capacitance between the bonding pad 701 and the substrate layer 101 is reduced, and the performance of the memory structure is increased. Further, the isolation structure can be formed simultaneously during the process of forming the first contacts penetrating through the substrate layer, and no additional process is required.

DETAILED DESCRIPTION

Embodiments of a memory structure and a forming method thereof provided by this invention are described in detailed and taken in conjunction with the drawings below.

FIG. 1 to FIG. 7 schematically illustrate structures in the processes of forming a memory structure according to an embodiment of this invention.

Figure 1:
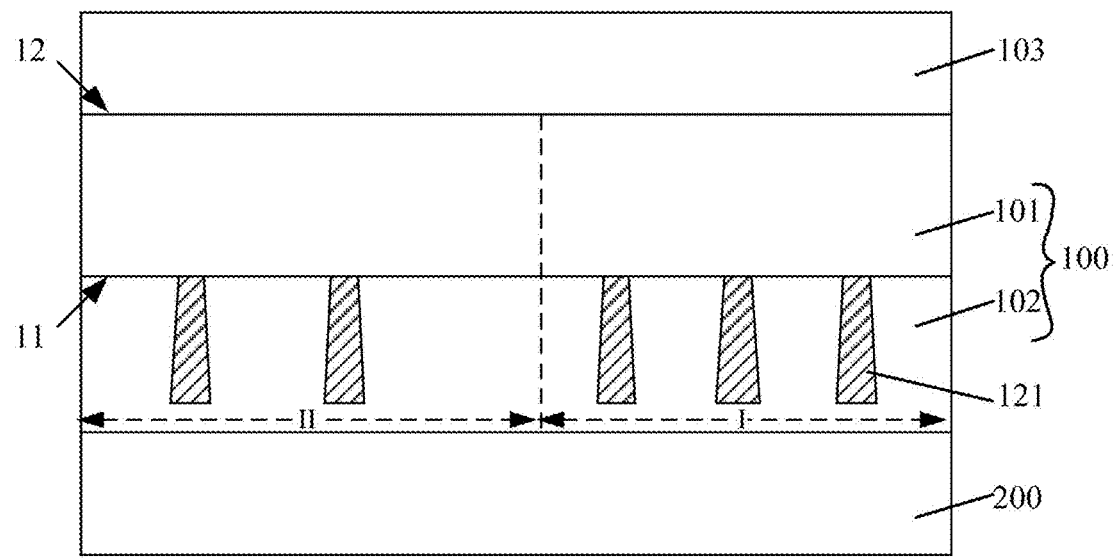
FIG. 1 to FIG. 7 schematically illustrate structures in the processes of forming a memory structure according to an embodiment of this invention.

Referring to FIG. 1, a first substrate 100 is provided, and the first substrate 100 includes: a substrate layer 101 and a storage layer 102, the substrate layer 101 including a first surface 11 and a second surface 12 opposite to the first surface 11, and the storage layer 102 being disposed on the first surface 11 of the substrate layer 101, wherein the first substrate 100 includes a bonding pad region I; and a dielectric layer 103 is formed on the second surface 12 of the substrate layer 101.

In FIG. 1, the first substrate 100 is in an inverted state. In the inverted state, the first surface 11 of the substrate layer 101 is a bottom surface of the substrate layer 101, and the second surface 12 is a top surface of the substrate layer 101. The first surface 11 of the substrate layer 101 is covered by the storage layer 102. In the inverted state, the corresponding storage layer 102 is disposed below the substrate layer 101. The reader can understand the actual relative positions between various material layers in the description of embodiments of this invention by combining the written description with the actual relative positions shown in the attached drawings of the specific embodiment to understand.

The substrate layer 101 is a semiconductor material layer. The substrate layer 101 may be a monocrystalline silicon wafer, a monocrystalline silicon wafer and a semiconductor epitaxial layer on the surface of the wafer, a silicon-on-insulator substrate, etc. In this embodiment, the substrate layer 101 includes the monocrystalline silicon wafer and the monocrystalline epitaxial layer disposed on the surface of the monocrystalline wafer. The surface of the monocrystalline epitaxial layer is the first surface 11, and the second surface 12 is the surface at the other side of the monocrystalline silicon wafer.

The storage layer 102 includes an insulating layer and one or more memory cells and one or more memory circuit structures formed in the insulating layer, and the circuit structures are connected to the memory cells. In one embodiment, 3D NAND memory cells are formed in the storage layer 102. A plurality of second contacts 121 are formed in the storage layer 102. The second contacts 121 can be the interconnection structure used for connecting the memory cells. The second contacts 121 can also be the interconnection structure used for connecting the substrate layer 101 and the circuits in the second substrate 200. In FIG. 1, a portion of the second contacts 121 in the storage layer 102 is shown for illustration only.

The bonding pad region I of the first substrate 100 is used for forming the circuit connection structure connecting circuits of different layers, and the bonding pads used for connecting external circuits and internal circuits are formed on the bonding pad region I later. Therefore, functional regions such as the doped wells are generally not formed in the substrate layer 101 in the bonding pad region I, and the second contacts 121 are formed in the storage layer 102 in the bonding pad region I. The first contacts penetrating the substrate layer 101 in the bonding pad region I are formed later, and the circuits in the storage layer 102 can be connected to the external parts through the second contacts 121 and the first contacts.

The first substrate 100 further includes a device region II disposed outside the bonding pad region I. The device region II of the first substrate 100 is used for forming the semiconductor devices therein, and the bonding pad region I is usually disposed at the periphery of the device region II. In one embodiment, the doped wells are formed in the substrate layer 101 in the device region II, and the memory cells are formed in the storage layer 102 in the device region II. During the operation of the memory structure, currents need to flow in the substrate layer 101 in the device region II.

The deposition process can be used for forming the dielectric layer 103 on the second surface 12 of the substrate layer 101. The dielectric layer 103 serves as a passivation layer covering the second surface 12 of the substrate layer 101, for protecting the second surface 12 of the substrate layer 101. The material of the dielectric layer 103 may be tetraethoxysilane (TEOS), silicon nitride, silicon oxynitride, silicon oxide, or other insulating dielectric materials. The dielectric layer 103 may be a single layer structure or a multi-layer stacked structure. The dielectric layer 103 may be formed by various deposition processes such as the chemical vapor deposition process, the spin coating process, the atomic layer deposition process, etc.

In this embodiment, the surface at the other side of the storage layer 102 that is opposite to the substrate layer 101 is further bonded and connected to a second substrate 200. A peripheral circuit is formed in the second substrate 200, the second substrate 200 is disposed on the surface of the storage layer 102, and the peripheral circuit in the second substrate 200 and the memory circuit structure in the storage layer 102 are electrically connected. Specifically, the surface of the connection portions of the peripheral circuit is exposed at the surface of the second substrate 200 facing the storage layer 102, and the surface of the connection portions of the memory circuit structure is exposed at the surface of the storage layer 102. The connection portions of the peripheral circuit can be bonded to the connection portions of the memory circuit structure to electrically connect the peripheral circuit and the memory circuit structure.

Figure 2:
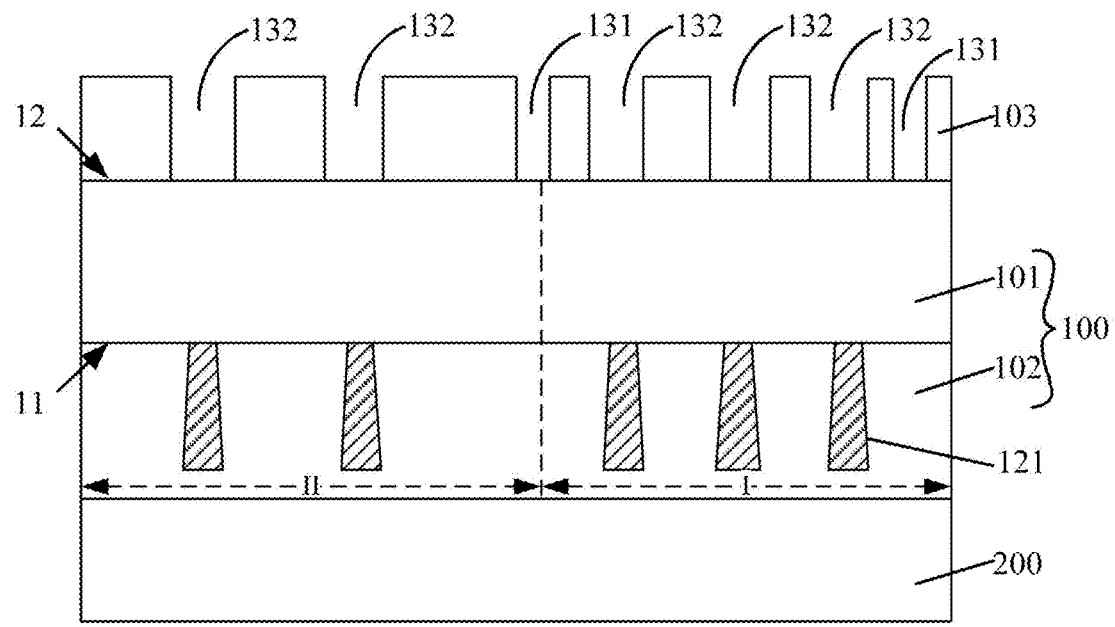

Referring to FIG. 2, the dielectric layer 103 is etched to the second surface 12 of the substrate layer 101, and a first opening 131 and a plurality of second openings 132 are formed in the dielectric layer 103.

Specifically, the forming method of the first opening 131 and the second openings 132 includes following steps. A photoresist layer is formed on the surface of the dielectric layer 103 and is exposed and developed by using a photomask to form a patterned photoresist layer. The dielectric layer 103 is etched by using the patterned photoresist layer as a mask layer to form the first opening 131 and the second openings 132. The first opening 131 is used for defining the position and the size of the isolation structure formed later, and the second openings 132 are used for defining the positions and the sizes of the first contacts penetrating through the substrate layer 101 and formed later. The same photomask is used to perform the photolithography process to form the patterned photoresist layer on the dielectric layer 103, and then the dielectric layer 103 is etched to form the second openings 132 and the first opening 131 simultaneously, thus no additional process is required to form the isolation structure.

The first opening 131 is a ring-shaped trench. The second openings 132 are holes, and the lateral cross-section of the second opening 132 may be circle, rectangle, polygon, etc.

In this embodiment, the second openings 132 are not only formed in the dielectric layer above the bonding pad region I, but also formed in the dielectric layer above the device region II. Therefore, the first contacts connecting the storage layer 102 can be simultaneously formed in the bonding pad region I and the device region II later.

Figure 3:
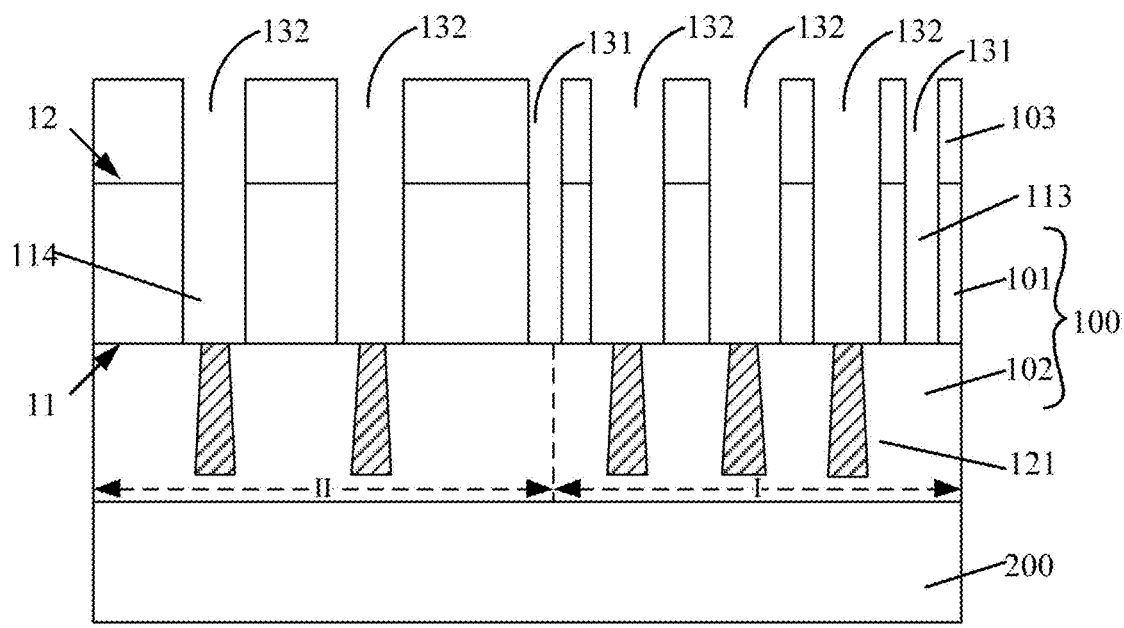

Referring to FIG. 3, the substrate layer 101 is etched through the first opening 131 and the second openings 132 simultaneously to respectively form an isolation trench 113 and a plurality of contact holes 114 penetrating through the substrate layer 101.

The bottoms of the contact holes 114 expose the second contacts 121 in the storage layer 102. The subsequently formed first contacts in the contact holes 114 that penetrate the substrate layer 101 will be connected to the second contacts 121 in the storage layer 102.

The isolation trench 113 is disposed at the edge of the bonding pad region I and surrounds the bonding pad region I. In this embodiment, the isolation trench 113 is disposed at the interface between the bonding pad region I and the device region II. The sidewall of one side of the isolation trench 113 exposes the substrate layer 101 in the bonding pad region I, and the sidewall of the another side of the isolation trench 113 exposes the substrate layer 101 in the device region II. In another embodiment, the isolation trench 113 is completely disposed in the bonding pad region I. In still another embodiment, the isolation trench 113 can also be completely disposed in the device region II and close to the bonding pad region I. In still another embodiment, the isolation trench 113 is not only formed at the edge of the bonding pad region I, other isolation trenches can also be formed between the contact holes 114 in the bonding pad region I at the same time.

The critical dimension of the isolation trench 113 is less than the critical dimension of the contact holes 114. In this embodiment, the critical dimension of the isolation trench 113 is the width of the isolation trench 113, the lateral cross-section of each of the contact holes 114 is a circle, and the critical dimension of the contact holes 114 is a diameter of the lateral cross-section of each of the contact hole 114. In the embodiments of this invention, the width of the isolation trench 113 is less than half of the diameter of the contact hole 114 and greater than 20 nanometers (nm). The maximum of the diameters of the contact holes 114 is 1500 nm.

Figure 4:
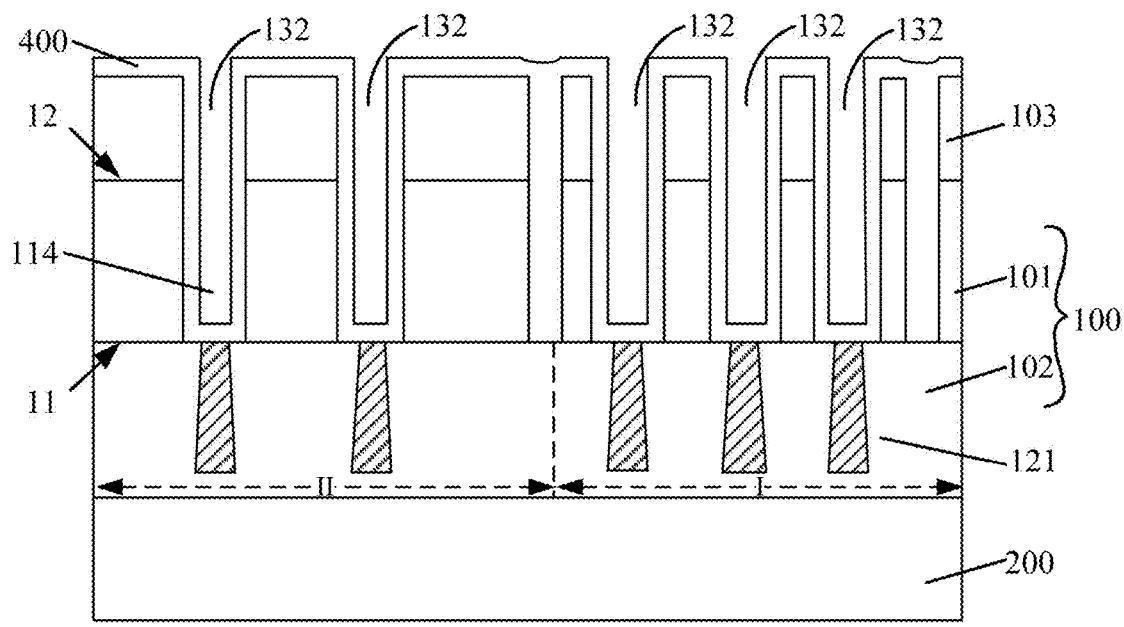

Referring to FIG. 4, an insulating material layer 400 is formed to fill the isolation trench 113 (referring to FIG. 3) and the first opening 131 (referring to FIG. 3) and to cover the surface of the internal sidewall of each of the contact holes 114 and the surface of the internal sidewall of each of the second openings 132.

The material of the insulating material layer 400 may be silicon oxide, silicon oxynitride, silicon nitride, or other insulating dielectric materials. The insulating material layer 400 may be formed by the chemical vapor deposition process, the atomic layer deposition process, the plasma-enhanced chemical vapor deposition process, etc. Since the critical dimension of the isolation trench 113 is less than the critical dimension of the contact holes 114, the insulating material layer 400 only covers the surface of the internal sidewall of each of the contact hole 114 and the surface of the internal sidewall of each of the second openings 132 when the isolation trench 113 and the first opening 131 are fully filled by the insulating material layer 400.

The insulating material layer 400 further covers the surface of the dielectric layer 103.

Figure 5:
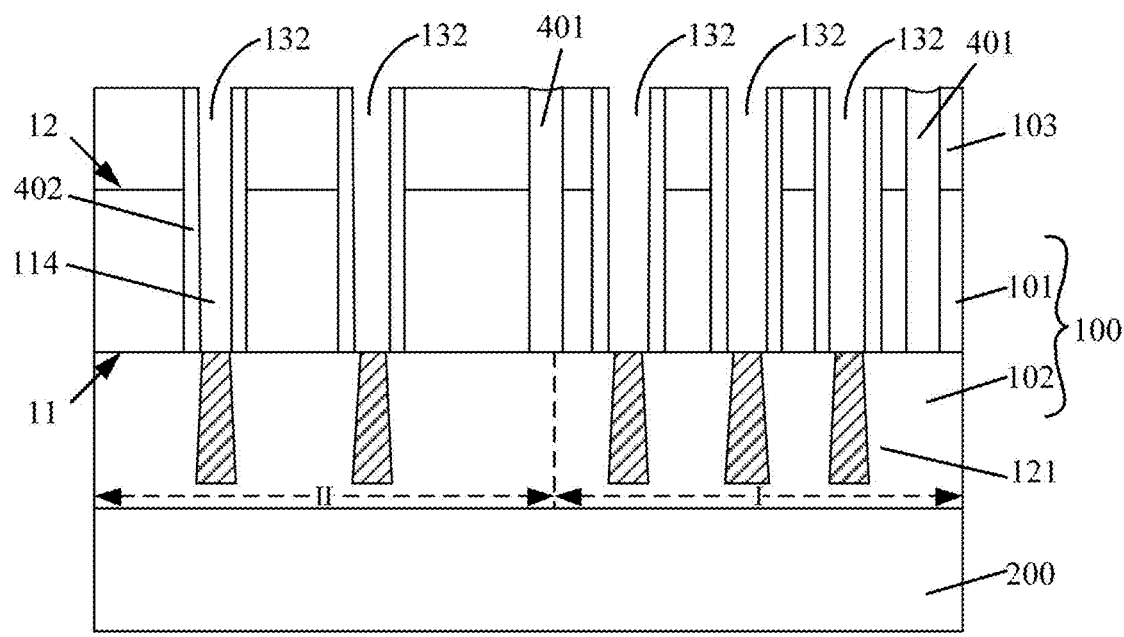

Referring to FIG. 5, the insulating material layer 400 disposed at the bottoms of the contact holes 114 is removed, thus a plurality of insulation sidewalls 402 are formed covering the sidewalls of the contact holes 114 and the second openings 132. The insulating material layer filled in the isolation trench 113 and the first opening 131 serves as an isolation structure 401.

The insulating material layer 400 disposed at the bottoms of the contact holes 114 is removed by adopting an anisotropic etching process. The insulating material layer 400 disposed on the surface of the dielectric layer 103 is also removed when the insulating material layer 400 disposed at the bottoms of the contact holes 114 is removed. In other embodiments, the insulating material layer 400 having a certain thickness is remained on the dielectric layer 103 after the insulating material layer 400 disposed at the bottoms of the contact holes 114 is removed.

The isolation structure 401 surrounds the substrate layer 101 in the bonding pad region I. A physical isolation is formed between the substrate layer 101 in the bonding pad region I and the substrate layer 101 at the periphery of the isolation structure 401. During the operation of the memory structure, there is no current flowing in the substrate layer 101 in the bonding pad region I while the current flows in the substrate layer 101 in the device region II due to the isolation effect provided by the isolation structure 401. Accordingly, the parasitic capacitance occurs between the substrate layer 101 in the bonding pad region I and the bonding pad formed above the bonding pad region I later can be reduced. Therefore, the thickness of the dielectric layer 103 is not required to be increased to reduce the parasitic capacitance, and the dielectric layer 103 can have a thinner thickness. In one embodiment, the thickness of the dielectric layer 103 is greater than 100 nm. For example, the thickness of the dielectric layer 103 may be in the range from 100 nm to 500 nm. In one embodiment, the thickness of the dielectric layer 103 is 400 nm.

In this embodiment, the isolation structure 401 is formed simultaneously in the process of forming the insulation sidewalls 402, and no additional process is required.

Figure 6:
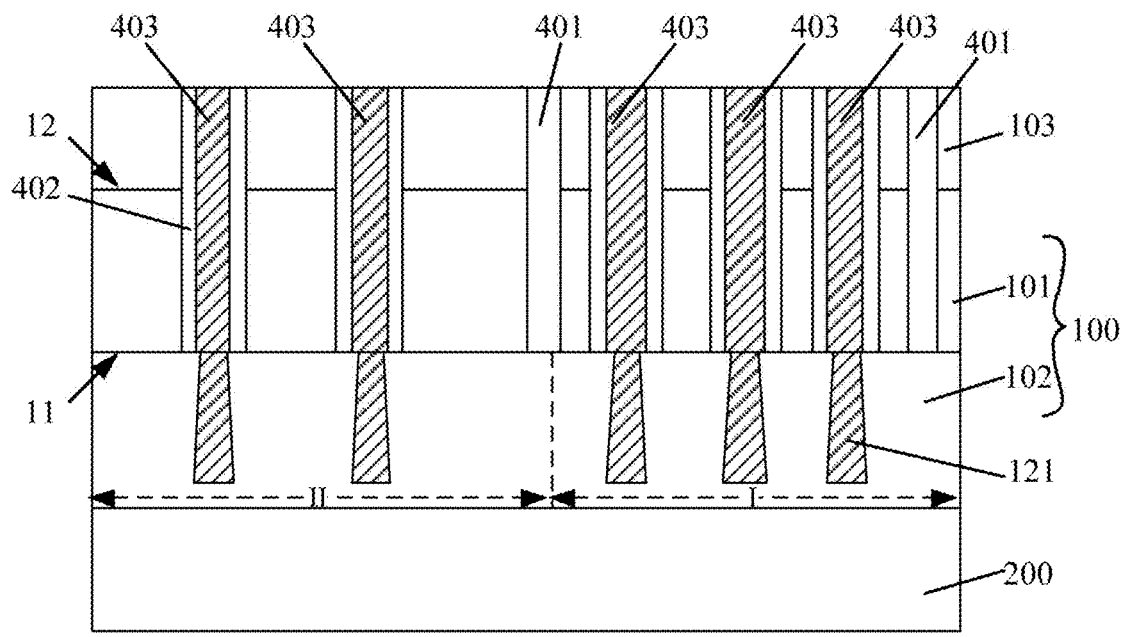

Referring to FIG. 6, a metallic material layer is formed to fill the contact holes 114 and the second openings 132. Additionally, the dielectric layer 103 is taken as a stop layer to perform a planarization process to from a plurality of metal pillars 403 disposed in the contact holes 114 (referring to FIG. 5) and the second openings 132 (referring to FIG. 5). The insulation sidewalls 402 and the metal pillars 403 form the first contacts.

The material of the metallic material layer may be tungsten (W), copper (Cu), aluminum (Al), gold (Au), or other metallic materials. The metallic material layer may be formed by physical vapor deposition process, such as the sputtering process.

The planarization process is performed on the metallic material layer to remove the metallic material layer disposed on the surface of the dielectric layer 103 to form the metal pillars 403. The metal pillars 403 are connected to the second contacts 121 in the storage layer 102 to connect the memory circuit structure in the storage layer 102.

Figure 7:
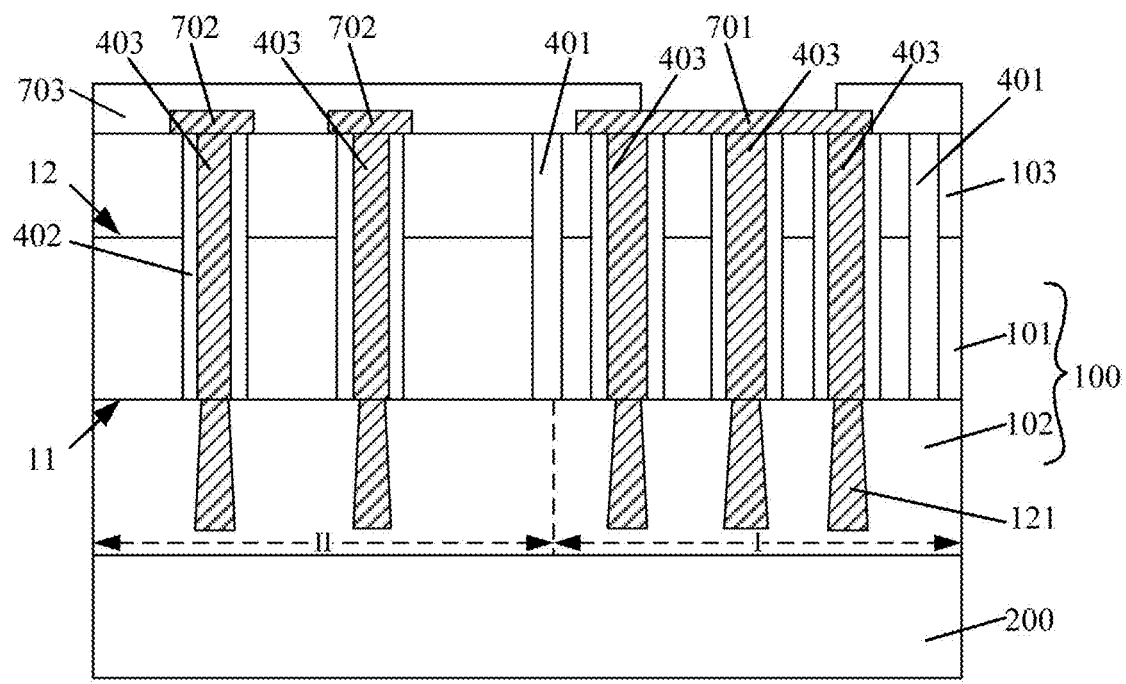

Referring to FIG. 7, a bonding pad 701 and a protection layer 703 covering the dielectric layer 103 and the bonding pad 701 are formed on the surface of the dielectric layer 103 above the bonding pad region I. The protection layer 703 has an opening that exposes the surface of the bonding pad 701.

A plurality of interconnection lines 702 are formed on the surface of the dielectric layer 103 above the device region II while forming the bonding pad 701. The interconnection lines 702 are connected to the metal pillars 403 in the device region II.

The minimum distance between the isolation structure 401 and the projection of the bonding pad 701 on the substrate layer 101 is 0.5 micrometers (μm). This provides the sufficient process windows for forming the bonding pad 701 and the isolation structure 401 and ensures that the substrate layer 101 disposed under the bonding pad 701 can be totally surrounded by the isolation structure 401. Generally, the bonding pad 701 is a rectangle and may have a length in the range from 70 μm to 80 μm, and the area of the bonding pad 701 is relatively large, such that it could easily form a relatively large parasitic capacitance. In the embodiments in this invention, the substrate layer 101 under the bonding pad 701 is isolated by the isolation structure 401, thus there is no current flowing through the substrate layer 101 under the bonding pad 701, so as to reduce the parasitic capacitance formed between the bonding pad 701 and the substrate layer 101.

The interconnection lines 702 and the bonding pad 701 are formed simultaneously. Specifically, a metal layer covering the dielectric layer 103 and the first contacts is formed. Next, the etching process is performed to the metal layer for patterning the metal layer, and the bonding pad 701 and the interconnection lines 702 are formed accordingly. Then, the protection layer 703 covering the dielectric layer 103, the interconnection lines 702, and the bonding pad 701 is formed, and the protection layer 703 is etched to expose the surface of the bonding pad 701. The bonding pad 701 can therefore be further connected to the external circuits. The material of the interconnection lines 702 and the bonding pad 701 may be Al, Cu, Au, Ag, or other metals.

The sizes of the interconnection lines 702 are relatively small. In this embodiment, the widths of the interconnection lines 702 are 600 nm, no large parasitic capacitance will be formed by the interconnection lines 702, and the influence on the performance of the memory device is therefore smaller. In other embodiments, the widths of the interconnection lines 702 may also be in the range from 500 nm to 700 nm.

Since the isolation structure 401 is formed in the substrate layer 101 and serves as the physical isolation structure disposed between the substrate layer 101 under the bonding pad 701 and the substrate layer 102 in the device region II in this embodiment, there is no current flowing in the substrate layer 101 under the bonding pad 701. Accordingly, the parasitic capacitance between the bonding pad 701 and the substrate layer 101 is reduced, and the performance of the memory structure is increased. Additionally, the parasitic capacitance between the bonding pad 701 and the substrate layer 101 can still be small when the dielectric layer 103 has a small thickness. In this embodiment, the thickness of the dielectric layer 103 may be 400 nm. In other embodiments, the thickness of the dielectric layer 103 may be in the range from 300 nm to 500 nm. The thickness of the dielectric layer 103 is small, and therefore the aspect ratios of the contact holes 114 and the isolation trench 113 can also be small, such that the difficulty of the manufacturing process can be reduced accordingly.

In another embodiment, the substrate layer 101 can be etched to form the isolation trench before the dielectric layer 103 is formed. The isolation material is filled in the isolation trench to form the isolation structure. Next, the dielectric layer 103 is formed on the second surface 12 of the substrate layer 101, and the dielectric layer 103 and the substrate layer 101 are etched to form the contact holes penetrating the dielectric layer 103 and the substrate layer 101. The insulation sidewalls 402 are formed on the surfaces of the internal sidewalls of the contact holes, and the metal pillars 403 filling the contact holes are formed.

In the above embodiments, the isolation structure 401 is a single isolation ring.

Figure 8:
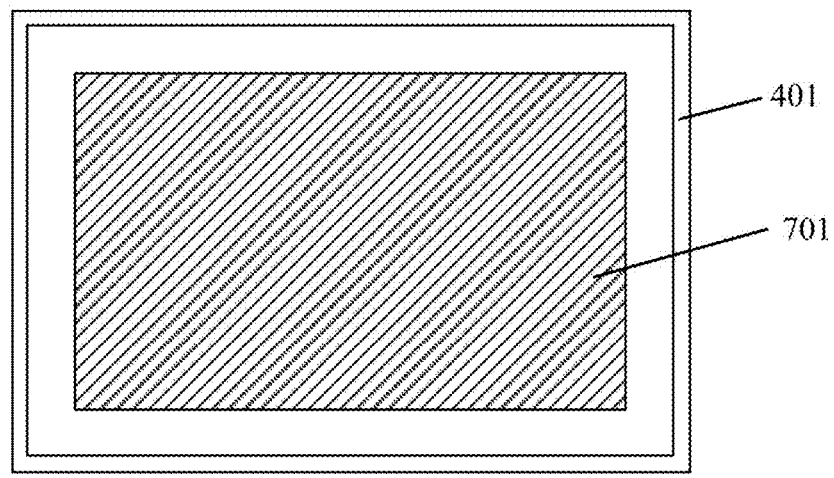
FIG. 8 to FIG. 10 schematically illustrate top views of isolation rings and a bonding pad in the memory structure according to embodiments of this invention.

Referring to FIG. 8, FIG. 8 schematically illustrates a top view of the isolation structure 401 and the bonding pad 701. The shape of the bonding pad 701 is a rectangle. The shape of the region surrounded by the isolation structure 401 is the same as the shape of the bonding pad 701. The distance between the isolation structure 401 and the bonding pad 701 is constant. In other embodiments, the isolation structure 401 may have the annular shape or other shapes.

In other embodiments, the isolation structure can include two or more isolation rings, and one of the isolation rings is embedded or surrounded by another one of the isolation rings.

Figure 9:
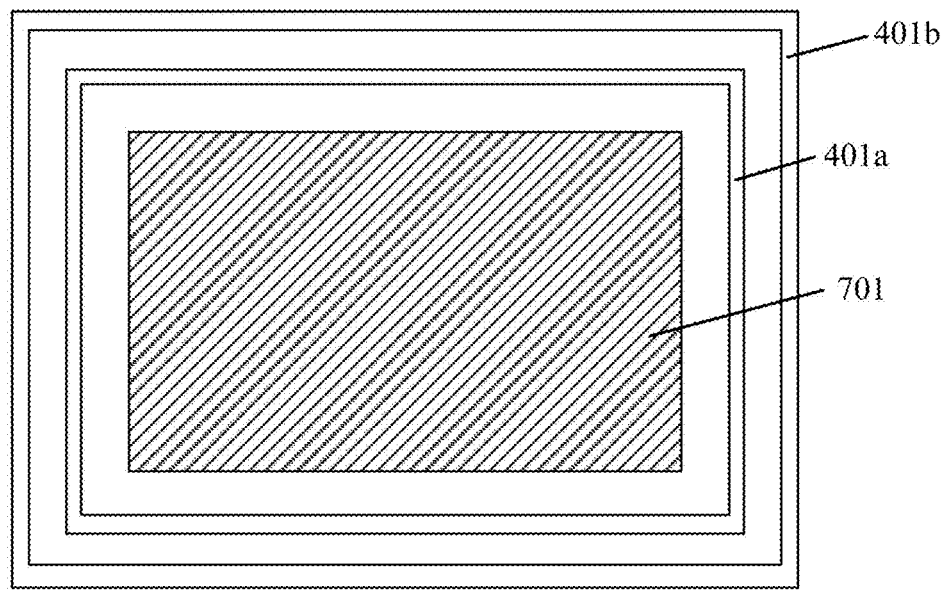

Referring to FIG. 9, two isolation rings of the isolation structure in another embodiment respectively are an isolation ring 401a and an isolation ring 401b. The isolation ring 401a is embedded or surrounded by the isolation ring 401b. In this embodiment, the distance between the isolation ring 401a and the isolation ring 401b is constant, thereby keeping the isolation effect consistent at different positions. The isolation ring 401a may be disposed in the bonding pad region I, and the isolation ring 401b may be disposed in the device region II. Alternatively, the isolation ring 401a and the isolation ring 401b may both be disposed in the device region II or in the bonding pad region I. The isolation effect can be enhanced through isolating the surrounded region in the substrate layer 101 by two isolation rings. The distance between the isolation ring 401a and the isolation ring 401b may be in the range from 0.8 μm to 1.2 μm. In other embodiments, the distance between the isolation ring 401a and the isolation ring 401b may be different according to different positions.

Figure 10:
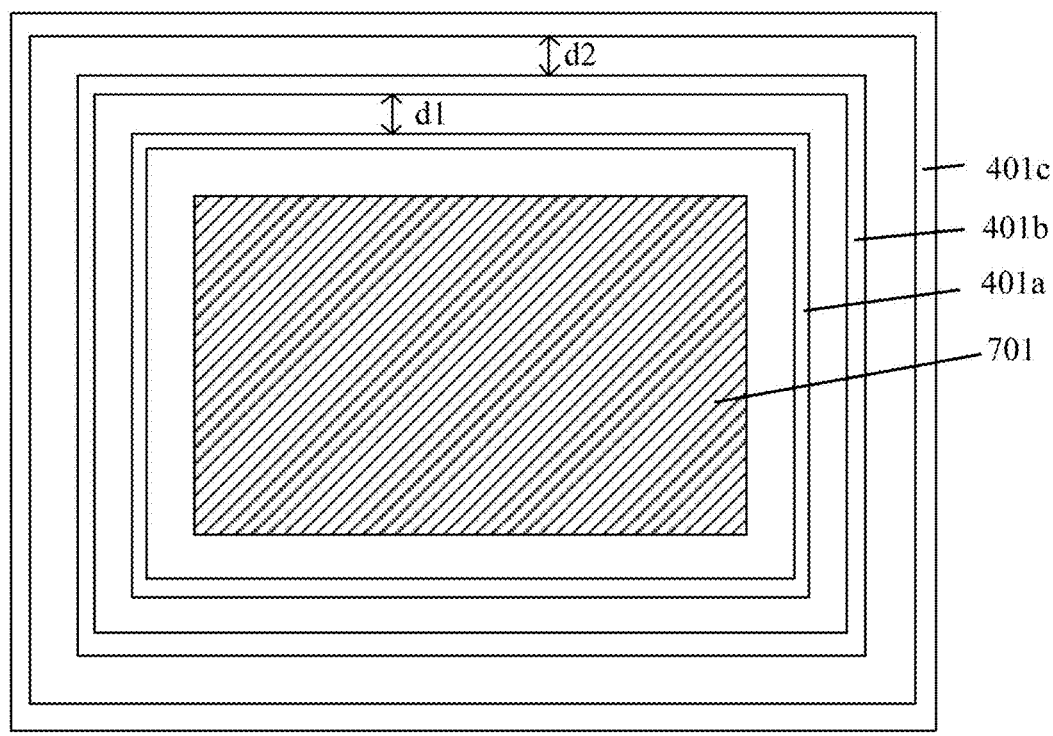

Referring to FIG. 10, the isolation structure in another embodiment includes three isolation rings, which respectively are an isolation ring 401a, an isolation ring 401b, and an isolation ring 401c. A distance d1 between the isolation ring 401a and the isolation ring 401b is equal to a distance d2 between the isolation ring 401b and the isolation ring 401c (d1=d2) in this embodiment. In other embodiments, d1 and d2 may be different.

The isolation structure including multiple isolation rings can further enhance the isolation effect and minimize the parasitic capacitance between the bonding pads 701 and the substrate layer 101.

The embodiments of this invention further provide a memory structure formed by the above methods.

Referring to FIG. 7, FIG. 7 schematically illustrates a structure of the memory structure according to an embodiment of this invention.

The memory structure includes: a first substrate 100, including: a substrate layer 101 and a storage layer 102, the substrate layer 101 including a first surface 11 and a second surface 12 opposite to the first surface 11, and the storage layer 102 being disposed on the first surface 11 of the substrate layer 101, wherein the first substrate 100 includes a bonding pad region I; a dielectric layer 103 disposed on the second surface 12 of the substrate layer 101; the bonding pad 701 disposed on the surface of the dielectric layer 103 above the bonding pad region I; and an isolation structure 401 penetrating through the substrate layer 101 and disposed at an edge of the bonding pad region I, wherein the isolation structure 401 surrounds the substrate layer 101 in the bonding pad region I, and the isolation structure 401 is used for isolating the substrate layer 101 in the bonding pad region I from the substrate layer 101 at a periphery of the isolation structure 401.

The substrate layer 101 is a semiconductor material layer. The substrate layer 101 may be a monocrystalline silicon wafer, a monocrystalline silicon wafer and a semiconductor epitaxial layer on the surface of the wafer, a silicon-on-insulator substrate, etc. In this embodiment, the substrate layer 101 includes the monocrystalline silicon wafer and the monocrystalline epitaxial layer disposed on the surface of the monocrystalline wafer. The surface of the monocrystalline epitaxial layer is the first surface 11, and the second surface 12 is the surface at the other side of the monocrystalline silicon wafer.

In FIG. 7, the first substrate 100 is in an inverted state. In the inverted state, the first surface 11 of the substrate layer 101 is a bottom surface of the substrate layer 101, and the second surface 12 is a top surface of the substrate layer 101. The first surface 11 of the substrate layer 101 is covered by the storage layer 102. In the inverted state, the corresponding storage layer 102 is disposed below the substrate layer 101.

The storage layer 102 includes an insulating layer and one or more memory cells and one or more memory circuit structures formed in the insulating layer, and the circuit structures are connected to the memory cells. In one embodiment, 3D NAND memory cells are formed in the storage layer 102. A plurality of second contacts 121 are formed in the storage layer 102. The second contacts 121 can be the interconnection structure used for connecting the memory cells. The second contacts 121 can also be the interconnection structure used for connecting the substrate layer 101 and the circuits in the second substrate 200.

In this embodiment, the surface at the other side of the storage layer 102 that is opposite to the substrate layer 101 is further bonded and connected to a second substrate 200. A peripheral circuit is formed in the second substrate 200, the second substrate 200 is disposed on the surface of the storage layer 102, and the peripheral circuit in the second substrate 200 and the memory circuit structure in the storage layer 102 are electrically connected. Specifically, the surface of the connection portions of the peripheral circuit is exposed at the surface of the second substrate 200 facing the storage layer 102, the surface of the connection portions of the memory circuit structure is exposed at the surface of the storage layer 102, the connection portions of the peripheral circuit can be bonded to the connection portions of the memory circuit structure to electrically connect the peripheral circuit and the memory circuit structure.

The first substrate 100 further includes a device region II, the device region II is used for forming the semiconductor devices, and the bonding pad region I is usually disposed at the periphery of the device region II. In one embodiment, the doped wells are formed in the substrate layer 101 in the device region II, and the memory cells are formed in the storage layer 102 in the device region II. During the operation of the memory structure, currents need to flow in the substrate layer 101 in the device region II. The bonding pad region I of the first substrate 100 is used for forming the circuit connection structure connecting circuits of different layers, and the bonding pads used for connecting external circuits and internal circuits are formed on the bonding pad region I later. Therefore, functional regions such as the doped wells are generally not formed in the substrate layer 101 in the bonding pad region I, and the second contacts 121 are formed in the storage layer 102 in the bonding pad region I. The first contacts penetrating the substrate layer 101 in the bonding pad region I are formed later, and the circuits in the storage layer 102 can be connected to the external parts through the second contacts 121 and the first contacts. In FIG. 1, a portion of the second contacts 121 in the storage layer 102 is shown for illustration only.

The dielectric layer 103 is used as a passivation layer disposed on the second surface 12 of the substrate layer 101, for protecting the second surface 12 of the substrate layer 101. The material of the dielectric layer 103 may be TEOS, silicon nitride, silicon oxynitride, silicon oxide, or other insulating dielectric materials. The dielectric layer 103 may be a single layer structure or a multi-layer stacked structure. The dielectric layer 103 may be formed by the chemical vapor deposition process, the spin coating process, the atomic layer deposition process, or other deposition processes. In this embodiment, the thickness of the dielectric layer 103 is greater than 100 nm. For example, the thickness of the dielectric layer 103 may be in the range from 100 nm to 500 nm. In one embodiment, the thickness of the dielectric layer 103 is 400 nm.

The isolation structure 401 includes the isolation trench penetrating through the substrate layer 101 and the isolation material filling the isolation trench. The isolation material may be silicon oxide, silicon oxynitride, silicon nitride, or other insulating dielectric materials. In this embodiment, the isolation structure 401 further penetrates through the dielectric layer 103. In another embodiment, the isolation structure 401 may be disposed in the substrate layer 101 only.

The isolation structure 401 is disposed at the edge of the bonding pad region I and surrounds the bonding pad region I. In this embodiment, the isolation structure 401 is disposed at the interface between the bonding pad region I and the device region II. The sidewall of one side of the isolation structure 401 is in contact with the substrate layer 101 in the bonding pad region I, and the sidewall of the other side of the isolation structure 401 is in contact with the substrate layer 101 in the device region II. In another embodiment, the isolation structure 401 is completely disposed in the bonding pad region I. In still another embodiment, the isolation structure 401 can also be completely disposed in the device region II and close to the bonding pad region I. In still another embodiment, the isolation structure 401 is not only formed at the edge of the bonding pad region I, other isolation structures can also be formed between the metal pillars 403 of the first contacts in the bonding pad region I at the same time.

The isolation structure 401 surrounds the substrate layer 101 in the bonding pad region I. A physical isolation is formed between the substrate layer 101 in the bonding pad region I and the substrate layer 101 at the periphery of the isolation structure 401. During the operation of the memory structure, there is no current flowing in the substrate layer 101 in the bonding pad region I while the current flows in the substrate layer 101 in the device region II due to the isolation effect provided by the isolation structure 401. The parasitic capacitance formed between the substrate layer 101 and the bonding pad 701 formed above the bonding pad region I can be reduced. Therefore, the thickness of the dielectric layer 103 is not required to be increased to reduce the parasitic capacitance.

The minimum distance between the isolation structure 401 and the projection of the bonding pad 701 on the substrate layer 101 is 0.5 μm. This provides the sufficient process windows for forming the bonding pad 701 and the isolation structure 401 and ensures that the substrate layer 101 disposed under the bonding pad 701 can be totally surrounded by the isolation structure 401. Generally, the bonding pad 701 is a rectangle and may have a length in the range from 70 μm to 80 μm, and the area of the bonding pad 701 is relatively large, such that it could easily form a relatively large parasitic capacitance. In the embodiments in this invention, the substrate layer 101 under the bonding pad 701 is isolated by the isolation structure 401, thus there is no current flowing through the substrate layer 101 under the bonding pad 701, so as to reduce the parasitic capacitance formed between the bonding pad 701 and the substrate layer 101.

The memory structure further includes the first contacts penetrating the dielectric layer 103 and the substrate layer 101. Each of the first contacts includes the metal pillar 403 and the insulation sidewall 402 disposed on the surface of the sidewall of the metal pillar 403. The material of the metal pillars 403 may be W, Cu, Al, Au, or other metallic materials. The metal pillars 403 are connected to the second contact 121 to connect the memory circuit structure in the storage layer 102. The first contacts are formed in both of the device region II and the bonding pad region I.

The critical dimension of the isolation structure 401 is less than the critical dimension of the first contacts. In this embodiment, the critical dimension of the isolation structure 401 is the width of the isolation structure 401. The lateral cross-section of each of the first contacts is a circle, and the critical dimension of the first contacts is a diameter of the lateral cross-section of each of the first contact. In one embodiment, the width of the isolation structure 401 is less than half of the diameter of the lateral cross-section of the first contact, and the width of the isolation structure 401 is greater than 20 nm. The maximum of the diameters of the lateral cross-sections of the first contacts is 1500 nm.

Since the isolation structure 401 and the first contacts all penetrate through the dielectric layer 103 and the substrate layer 101, the isolation trench and the contact holes can be formed simultaneously by etching the dielectric layer 103 and the substrate layer 101. Later, the isolation structure 401 filling the isolation trench can be simultaneously formed when the insulation sidewalls 402 are formed. No additional process is required.

The interconnection lines 702 are formed on the surface of the dielectric layer 103 above the device region II, and the interconnection lines 702 are connected to the first contacts in the device region II. The materials of the interconnection lines 702 and the bonding pad 701 may be Al, Cu, Au, Ag, or other metals. The sizes of the interconnection lines 702 are relatively small. In this embodiment, the widths of the interconnection lines 702 are 600 nm, no large parasitic capacitance will be formed by the interconnection lines 702, and the influence on the performance of the memory device is therefore smaller. In other embodiments, the widths of the interconnection lines 702 may also be in the range from 500 nm to 700 nm.

The protection layer 703 covering the dielectric layer 103, the interconnection lines 702, and the bonding pad 701 are formed on the surface of the dielectric layer 103. The protection layer 703 has an opening that exposes the surface of the bonding pad 701, and the bonding pad 701 can therefore be further connected to the external circuits later.

In the above embodiments, the isolation structure 401 is formed in the substrate layer 101 and served as the physical isolation structure disposed between the substrate layer 101 under the bonding pad 701 and the substrate layer 102 in the device region II. The substrate layer 101 under the bonding pad 701 is isolated from the surroundings and no current is formed therein. Accordingly, the parasitic capacitance between the bonding pad 701 and the substrate layer 101 is reduced, and the performance of the memory structure is increased. Further, since the parasitic capacitance between the bonding pad 701 and the substrate layer 101 is reduced by the isolation structure 401, the dielectric layer 103 having a smaller thickness can be adopted, and the aspect ratios of the first contacts and the isolation structure 401 penetrating through the dielectric layer 103 and the substrate layer 101 can be reduced, thereby reducing the difficulty of the manufacturing process.

In the above embodiments, the isolation structure 401 is a single isolation ring.

Referring to FIG. 8, FIG. 8 schematically illustrates a top view of the isolation structure 401 and the bonding pad 701. The shape of the bonding pad 701 is a rectangle. The shape of the region surrounded by the isolation structure 401 is the same as the shape of the bonding pad 701. The distance between the isolation structure 401 and the bonding pad 701 is constant. In other embodiments, the isolation structure 401 may have the annular shape or other shapes.

In other embodiments, the isolation structure can include two or more isolation rings, and one of the isolation rings is embedded or surrounded by another one of the isolation rings.

Referring to FIG. 9, two isolation rings of the isolation structure in another embodiment respectively are an isolation ring 401a and an isolation ring 401b. The isolation ring 401a is embedded or surrounded by the isolation ring 401b. In this embodiment, the distance between the isolation ring 401a and the isolation ring 401b is constant, thereby keeping the isolation effect consistent at different positions. The isolation ring 401a may be disposed in the bonding pad region I, and the isolation ring 401b may be disposed in the device region II. Alternatively, the isolation ring 401a and the isolation ring 401b may both be disposed in the device region II or in the bonding pad region I. The isolation effect can be enhanced through isolating the surrounded region in the substrate layer 101 by two isolation rings. The distance between the isolation ring 401a and the isolation ring 401b may be in the range from 0.8 µm to 1.2 µm. In other embodiments, the distance between the isolation ring 401a and the isolation ring 401b may be different according to different positions.

In this embodiment, the substrate layer 101 can be etched to simultaneously form two ring-shaped isolation trenches in the process of forming the isolation structure, wherein one of the isolation trenches is embedded or surrounded by the other one of the isolation trenches. Additionally, the insulating material can be filled in the ring-shaped isolation trenches to form the isolation ring 401a and the isolation ring 401b.

Referring to FIG. 10, the isolation structure in another embodiment includes three isolation rings, which respectively are an isolation ring 401a, an isolation ring 401b, and an isolation ring 401c. A distance d1 between the isolation ring 401a and the isolation ring 401b is equal to a distance d2 between the isolation ring 401b and the isolation ring 401c (d1=d2) in this embodiment. In other embodiments, d1 and d2 may be different.

The isolation structure including multiple isolation rings can further enhance the isolation effect and minimize the parasitic capacitance between the bonding pads 701 and the substrate layer 101.

The above description is only related to the preferred embodiments of this invention. It should be noted that several improvements and modifications can be made without departing from the principles of this invention for those skilled in the art. These improvements and modifications should also be considered as the scope of protection of this invention.

What is claimed is:

1. A memory structure, comprising:
    a first substrate comprising a substrate layer and a storage layer, the substrate layer including a first surface and a second surface opposite to the first surface, and the storage layer being disposed on the first surface of the substrate layer, wherein the first substrate comprises a bonding pad region;
    a dielectric layer disposed on the second surface of the substrate layer;
    a bonding pad disposed on a surface of the dielectric layer above the bonding pad region; and
    an isolation structure penetrating through the substrate layer and disposed at an edge of the bonding pad region, wherein the isolation structure surrounds the substrate layer in the bonding pad region, and the isolation structure is used for isolating the substrate layer in the bonding pad region from the substrate layer at a periphery of the isolation structure.

2. The memory structure of claim 1, further comprising a plurality of first contacts penetrating through the substrate layer in the bonding pad region and the dielectric layer, wherein the bonding pad is connected to the first contacts.

3. The memory structure of claim 2, wherein each of the first contacts comprises a metal pillar and an insulating sidewall disposed on a surface of a sidewall of the metal pillar.

4. The memory structure of claim 2, wherein a critical dimension of the isolation structure is less than a critical dimension of the first contacts.

5. The memory structure of claim 1, wherein the isolation structure comprises an isolation trench penetrating through the substrate layer and an isolation material filling the isolation trench.

6. The memory structure of claim 1, wherein a minimum distance between the isolation structure and a projection of the bonding pad on the substrate layer is 0.5 micrometers.

7. The memory structure of claim 1, wherein the isolation structure comprises two or more isolation rings, and one of the isolation rings is embedded or surrounded by another one of the isolation rings.

8. The memory structure of claim 7, wherein a distance between adjacent isolation rings of the two or more isolation rings is in a range from 0.8 micrometers to 1.2 micrometers.

9. The memory structure of claim 2, wherein a plurality of second contacts are formed in the storage layer, and the first contacts are connected to the second contacts.

10. The memory structure of claim 1, further comprising a second substrate,
  wherein a peripheral circuit is formed in the second substrate, and the second substrate is bonded to a surface of the storage layer, wherein a memory cell and a memory circuit structure connected to the memory cell are formed in the storage layer, and
  wherein the peripheral circuit in the second substrate and the memory circuit structure in the storage layer are electrically connected.

11. A forming method of a memory structure, comprising:
  providing a first substrate, the first substrate comprising a substrate layer and a storage layer, the substrate layer including a first surface and a second surface opposite to the first surface, the storage layer being disposed on the first surface of the substrate layer, and the first substrate comprising a bonding pad region;
  forming a dielectric layer on the second surface of the substrate layer;
  forming an isolation structure penetrating through the substrate layer, wherein the isolation structure is disposed at an edge of the bonding pad region and surrounds the substrate layer in the bonding pad region, and the isolation structure is used for isolating the substrate layer in the bonding pad region from the substrate layer at a periphery of the isolation structure; and
  forming a bonding pad on a surface of the dielectric layer above the bonding pad region.

12. The forming method of the memory structure of claim 11, further comprising forming a plurality of first contacts penetrating through the substrate layer in the bonding pad region and the dielectric layer, wherein the bonding pad is connected to the first contacts.

13. The forming method of the memory structure of claim 12, wherein a forming method of the first contacts and the isolation structure comprises:
  etching the dielectric layer to the substrate layer to forma first opening and a plurality of second openings in the dielectric layer;
  etching the substrate layer through the first opening and the second openings simultaneously to respectively form an isolation trench and a plurality of contact holes penetrating through the substrate layer;
  forming an insulating material layer filling the isolation trench and the first opening and covering a surface of an internal sidewall of each of the contact holes and a surface of an internal sidewall of each of the second openings;
  removing the insulating material layer disposed at bottoms of the contact holes;
  forming a metallic material layer filling the contact holes and the second openings; and
  performing a planarization process by using the dielectric layer as a stop layer.

14. The forming method of the memory structure of claim 12, wherein a critical dimension of the isolation structure is less than a critical dimension of the first contacts.

15. The forming method of the memory structure of claim 11, wherein forming the isolation structure penetrating through the substrate layer further comprises:
  forming an isolation trench penetrating through the substrate layer, wherein the isolation trench is disposed at the edge of the bonding pad region and surrounds the bonding pad region; and
  forming an isolation material filling the isolation trench.

16. The forming method of the memory structure of claim 11, wherein a minimum distance between the isolation structure and a projection of the bonding pad on the substrate layer is 0.5 micrometers.

17. The forming method of the memory structure of claim 11, wherein the isolation structure comprises two or more isolation rings, and one of the isolation rings is embedded or surrounded by another one of the isolation rings.

18. The forming method of the memory structure of claim 17, wherein a distance between adjacent isolation rings of the two or more isolation rings is in a range from 0.8 micrometers to 1.2 micrometers.

19. The forming method of the memory structure of claim 11, wherein a plurality of second contacts penetrating through the storage layer are formed in the storage layer, and the first contacts are connected to the second contacts.

20. The forming method of the memory structure of claim 11, wherein a second substrate is bonded to a surface of the storage layer of the first substrate, a memory cell and a memory circuit structure connected to the memory cell are formed in the storage layer, and a peripheral circuit in the second substrate and the memory circuit structure in the storage layer are electrically connected.

* * * * *